(12) United States Patent
Oka (10) Patent No.: US 10,277,221 B2
(45) Date of Patent: Apr. 30, 2019

(54) PROTECTION CIRCUIT (71) Applicant: DENSO CORPORATION, Kariya, Aichi-pref. (JP)

(72) Inventor: Norimasa Oka, Kariya (JP)

(73) Assignee: DENSO CORPORATION, Kariya (JP)

( * ) Notice: Subject to any disclaimer, the term of this patent is extended or adjusted under 35 U.S.C. 154(b) by 218 days.

(21) Appl. No.: 15/515,661

(22) PCT Filed: Oct. 13, 2015

(86) PCT No.: PCT/JP2015/005174
§ 371 (c)(1),
(2) Date: Mar. 30, 2017

(87) PCT Pub. No.: WO2016/063494
PCT Pub. Date: Apr. 28, 2016

(65) Prior Publication Data
US 2017/0302261 A1    Oct. 19, 2017

(30) Foreign Application Priority Data

Oct. 21, 2014 (JP) .................................. 2014-214425

(51) Int. Cl.
*H02M 1/08* (2006.01)
*H02M 1/32* (2007.01)
(Continued)

(52) U.S. Cl.
CPC ........ *H03K 17/08122* (2013.01); *H02M 1/08*
(2013.01); *H03K 17/162* (2013.01); *H02M
1/32* (2013.01); *H03K 2217/0027* (2013.01)

(58) Field of Classification Search
CPC .... H02M 1/08; H02M 1/32; H03K 17/08122; H03K 17/162; H03K 2217/0027
(Continued)

(56) References Cited

U.S. PATENT DOCUMENTS

2008/0258702 A1   10/2008   Kanamaru et al.
2012/0050922 A1   3/2012   Yamai et al.
(Continued)

FOREIGN PATENT DOCUMENTS

JP    2002-091789 A    3/2002
JP    4091793 B2       5/2008
(Continued)

*Primary Examiner* — Kevin J Comber
(74) *Attorney, Agent, or Firm* — POSZ Law Group, PLC (57) ABSTRACT

A protection circuit includes a periodicity determination device, an off circuit and a control device. The periodicity determination device directly or indirectly detects a noise superimposed on a first transistor including a control terminal and determines periodicity of the noise. The off circuit is connected to the control terminal of the first transistor and is configured to perform an off-operation of the first transistor. The control device enables the off-operation of the first transistor, performed by the off circuit, when the periodicity determination device determines that the noise has periodicity. The control device disables the off-operation of the first transistor, performed by the off circuit, when the periodicity determination device determines that the noise does not have periodicity. Accordingly, the protection circuit withdraws an ESD energy while stabilizing a circuit operation.

9 Claims, 8 Drawing Sheets

(51) Int. Cl.
*H03K 17/16* (2006.01)
*H03K 17/0812* (2006.01)

(58) Field of Classification Search
USPC .......................................................... 361/78
See application file for complete search history.

(56) References Cited

U.S. PATENT DOCUMENTS

2012/0091924 A1* 4/2012 Tran ..................... H05B 41/295
315/362
2015/0106043 A1 4/2015 Yamai et al.

FOREIGN PATENT DOCUMENTS

JP         4650688 B2    3/2011
JP     2012-195778 A    10/2012

* cited by examiner

PROTECTION CIRCUIT

CROSS REFERENCE TO RELATED APPLICATIONS

This application is a U.S. national stage of International Patent Application No. PCT/JP2015/005174 filed on Oct. 13, 2015 and is based on Japanese Patent Application No. 2014-214425 filed on Oct. 21, 2014, the disclosure of which is incorporated herein by reference.

TECHNICAL FIELD

The present disclosure relates to a protection circuit that protects a circuit.

BACKGROUND ART

Conventionally, a driving circuit that applies a driving signal to a transistor for driving a load has been provided (for example, see patent literature 1). According to a technique disclosed in the patent literature 1, when a gate voltage of an IGBT, which is a transistor, varies through a parasitic capacitance between a collector and a gate, there is a possibility that the IGBT erroneously or unsteadily operates according to the variation of the gate voltage. In order to restrict the variation of the gate voltage of the IGBT, a MOSFET, which is connected between the gate and a source of the IGBT, is turned on to stabilize the gate voltage and restrict malfunction of the circuit.

PRIOR ART LITERATURE

Patent Literature

Patent literature 1: JP-4650688-B2

SUMMARY OF INVENTION

In the case where the technique disclosed in the patent literature 1 is employed, when an instantaneously large noise, such as an electro-static-discharge (ESD), is applied to the collector of the IGBT, there is a possibility that malfunction occurs in the driving circuit. This kind of noise is preferably discharged to a discharge node, such as a ground, by performing a self-turn-on of the IGBT. However, when the MOSFET that coercively turns off the IGBT (i.e., corresponding to an off circuit) is on-controlled, the IGBT is coercively off-controlled, and thus the ESD energy is not withdrawn.

It is an object of the present disclosure to provide a protection circuit capable of withdrawing an ESD energy while stabilizing a circuit operation.

According to an aspect of the present disclosure, a protection circuit includes a periodicity determination device, an off circuit and a control device. The periodicity determination device directly or indirectly detects a noise superimposed on a first transistor that includes a control terminal. The periodicity determination device determines periodicity of the noise. The off circuit is connected to the control terminal of the first transistor. The off circuit is configured to perform an off-operation of the first transistor. The control device enables the off-operation of the first transistor, performed by the off circuit, when the periodicity determination device determines that the noise has the periodicity. The control device disables the off-operation of the first transistor, performed by the off circuit, when the periodicity determination device determines that the noise does not have the periodicity.

When the instantaneous noise that does not have the periodicity is superimposed, the periodicity determination device does not determine that the noise has the periodicity. The control device does not coercively perform the off-operation of the first transistor by the off circuit. As a result, the self-turn-on of the first transistor occurs and the ESD energy is discharged.

Conversely, when the noise that has the periodicity is superimposed, the periodicity determination device determines that the noise has the periodicity. The control device coercively performs the off-operation of the first transistor by the off circuit. In this case, since the first transistor is turned off, the circuit operation is stabilized.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Hereinafter, embodiments of a protection circuit that protects a protection target circuit from malfunction and surge voltage, caused by a noise, will be described with reference to the drawings. Portions that are the same or similar in the embodiments will be designated by the same or similar symbols.

First Embodiment

Figure 1A:
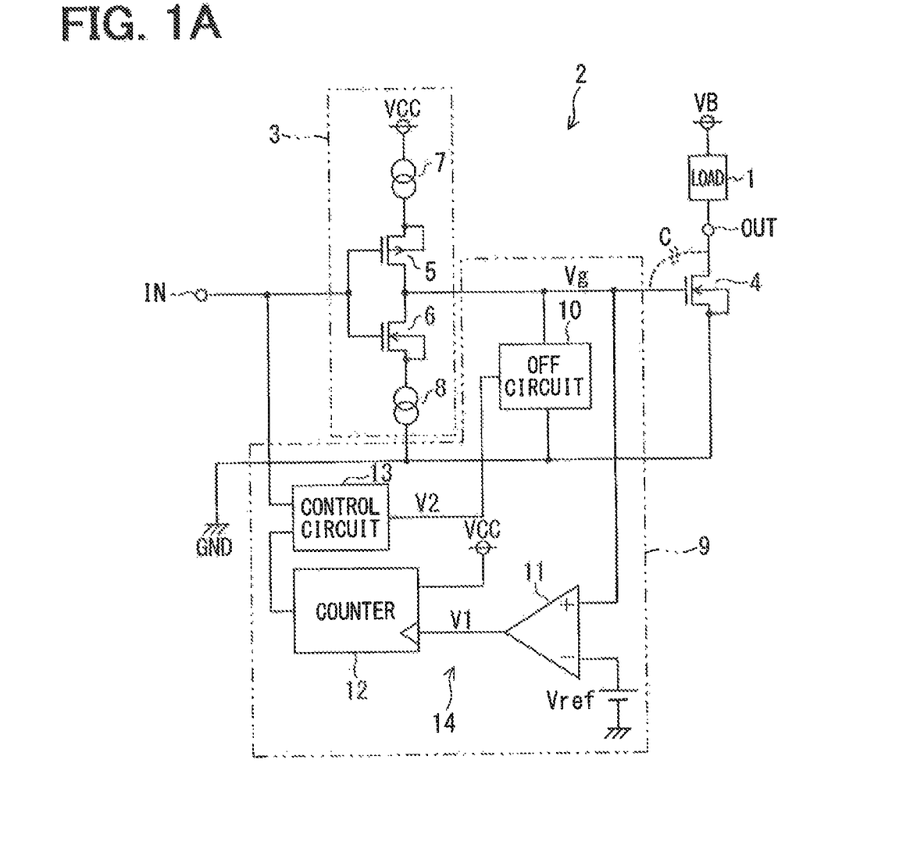
FIG. 1A is a configuration diagram schematically illustrating a configuration example of a protection circuit according to a first embodiment.
Figure 1B:
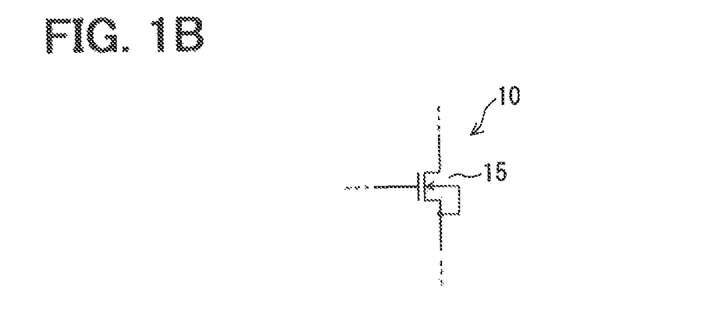
FIG. 1B is a configuration diagram schematically illustrating a configuration example of an off circuit provided in the protection circuit.
Figure 2:
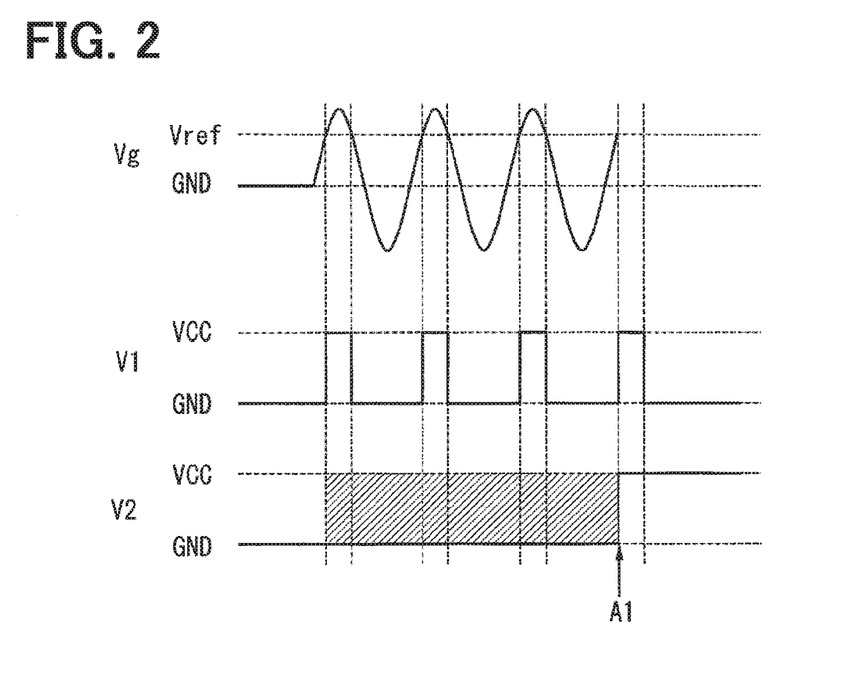
FIG. 2 is a timing chart schematically illustrating voltage variation of each node.

FIG. 1A, FIG. 1B and FIG. 2 are explanatory diagrams of the first embodiment. The circuit shown in FIG. 1A illustrates a configuration example in which the first embodiment is applied to a transistor driving circuit 2 driving a load 1. For example, the load 1 is a vehicular load such as an inductive load.

The transistor driving circuit 2 energizes and deenergizes voltage of a voltage source (VB: for example, 12V) to the load 1 according to a digital signal input to an input terminal. The transistor driving circuit 2 includes a main driving portion 3 and an N-channel-type MOSFET 4, which is hereinafter referred to as an NMOS transistor. The main driving portion 3 includes a constant current driving type inverter at an input side. The NMOS transistor 4 is a switching element for driving and has a control terminal connected to an output terminal of the main driving portion 3. The NMOS transistor 4 corresponds to a first transistor.

The main driving portion 3 includes a P-channel-type MOS transistor 5, which is hereinafter referred to as a PMOS transistor 5, and an N-channel-type MOS transistor 6, which is hereinafter referred to as an NMOS transistor 6. The main driving portion 3 includes constant current sources 7 and 8 for the constant current control of the NMOS transistor 4. The PMOS transistor 5 and the NMOS transistor 6 have gates (i.e., control terminals) commonly connected to each other. A common connection node of the PMOS transistor 5 and the NMOS transistor 6 is connected to an input terminal IN. A drain of the PMOS transistor 5 is connected to a terminal of a voltage source VCC through the constant current source 7. The voltage source VCC corresponds to a first voltage line and has, for example, 5V, which is lower than VB. When the PMOS transistor 5 is turned on, the constant current source 7 outputs a current to a gate of the NMOS transistor 4 (which is a control terminal of the switching element) through the drain and the source of the PMOS transistor 5. A drain of the NMOS transistor 6 is connected to a terminal of ground (which is a second voltage line) through the constant current source 8. When the NMOS transistor 6 is turned on, the constant current source 8 withdraws a current from the gate of the NMOS transistor 4 (which is the control terminal of the switching element) through the drain and the source of the NMOS transistor 6.

A protection circuit 9 is provided to protect the above described operations. The protection circuit 9 includes an off circuit 10, a comparison circuit 11, a counter 12 (a count device) and a control circuit 13. For example, the comparison circuit 11 includes a comparator. The comparison circuit 11 and the counter 12 provide a periodicity determination device 14.

The off circuit is provided mainly to execute off-control of the switching element. For example, as shown in FIG. 1B, one example of the off circuit 10 includes an N-channel-type MOS transistor 15. The NMOS transistor 15 corresponds to a second transistor. The off circuit 10 has an input terminal and an output terminal (i.e., a drain and a source) connected between the gate and the source of the NMOS transistor 4. The off terminal 10 has a control terminal (i.e., a gate) connected to the control circuit 13. The gate of the NMOS transistor 4 is connected to the comparison circuit 11. The comparison circuit 11 compares the gate of the NMOS transistor 4 with a predetermined threshold voltage Vref and outputs the comparison result to the counter 12. The counter 12 receives the comparison result and outputs a command signal to the control circuit 13 based on the count result.

The control circuit 13 receives the input data of the input terminal IN by an enable terminal of the control circuit 13 and also receives the count result of the counter 12. When the input data of the input terminal IN indicates "H", the control circuit 13 receives an off command signal from the counter 12 and outputs an off control signal to the off circuit 10. Conversely, when the input data of the input terminal IN indicates "L", the control circuit 13 ignores the signal outputted from the counter 12 and does not output the off control signal to the off circuit 10 so as not to operate the off circuit 10.

For example, when the off circuit 10 includes the NMOS transistor 15, a transistor that has a gate width comparatively less than a gate width of the NMOS transistor 4 for driving is employed as the NMOS transistor 15. Also, a transistor having a capability of energizing current lower than the NMOS transistor 4 for driving is employed as the NMOS transistor 15. When the NMOS transistor 15 is turned on (i.e., so-called "full-on-state"), the NMOS transistor 15 has energization current larger than the current of the constant current source 8.

Effects of the above configuration will be described with reference to FIG. 2. FIG. 2 schematically illustrates signals (i.e., voltages) of nodes. For example, FIG. 2 illustrates waveforms of the nodes when a sine wave noise as a periodic noise is superimposed on the output terminal OUT.

In a normal state, the off circuit 10 is in a disablement state. When the off circuit 10 is disabled, the gate-to-source of the NMOS transistor 4 is opened. The digital signal inputted to the input terminal IN is varied between "H" and "L" according to the given driving signals. The main driving portion 3 inverts the input digital signal and outputs the inverted signal to the gate of the NMOS transistor 4. When the input digital signal indicates "L", the PMOS transistor 5 is turned on and the NMOS transistor 6 is also turned on. The gate of the NMOS transistor 6 is applied with the current from the constant current source 7 to turn on the NMOS transistor 4. As such, the current is energized to the load 1. When the input data of the input terminal IN indicates "L", the control circuit 13 ignores the signal outputted from the counter 12 and does not output the off control signal to the off circuit 10 so as not to operate the off circuit 10.

Conversely, the input digital signal indicates "H", the PMOS transistor 5 is turned off and the NMOS transistor 6 is turned on. The constant current source 8 withdraws a current from the gate of the NMOS transistor 4 to turn off the NMOS transistor 4. As such, energization to the load 1 is suspended.

Hereinafter, a case will be described where the input digital signal indicates "H" and the periodic noise (for example, having 20V of maximum amplitude) is applied to the connection terminal of the load 1 (i.e., output terminal OUT). When the input digital signal indicates "H", the main driving portion 3 inverts this input digital signal and outputs "L". At the same time, the constant current source 8 withdraws the current from the gate of the NMOS transistor 4 to the ground through the NMOS transistor 6.

When the periodic noise having large amplitude is applied to the output terminal OUT, capacitive coupling occurs between the drain and the gate of the NMOS transistor 4 and the periodic noise is also applied to the gate of the NMOS transistor 4. When the NMOS transistor 4, which is an output, has a large gate capacitance and the constant current source 8 has lower capability of withdrawing the current, there is a possibility that the NMOS transistor 4 is periodically turned on according to the periodic noise, that is, there is a possibility that the NMOS transistor 4 erroneously operates. In the present embodiment, the comparison circuit 11 compares the gate voltage of the NMOS transistor 4 caused by the periodic noise with the threshold voltage Vref, and determines whether the gate voltage exceeds the threshold voltage Vref. Then, the counter 12 counts a numerical number of times that the gate voltage of the NMOS transistor 4 exceeds the threshold voltage Vref.

As a result, when the number of counting times of the counter 12 is more than a predetermined number of times (which is more than 2, e.g., 4), the control circuit 13 outputs the off control signal to the off circuit 10 and the off circuit 10 coercively turns off the NMOS transistor 4. For example, when the off circuit 10 includes the NMOS transistor 15, the control circuit 13 turns on the NMOS transistor 15 to short-circuit between the gate and the source of the NMOS transistor 4 (see a time point A1 in FIG. 2). As a result, the gate voltage of the NMOS transistor 4 is fixed to "L" (i.e., 0V) and an influence of the malfunction caused by the periodic noise is restricted.

Also, a case will be described in which an electro-static-discharge (ESD) noise is applied to the connection terminal of the load 1 (i.e., output terminal OUT). This electro-static-discharge noise (for example, more than tens of volts) is assumed to have higher voltage than the above described periodic noise (for example, 20V).

When the electro-static-discharge noise is applied to the output terminal OUT due to some kind of influence, this large static electricity causes a coupling between the drain and the gate and this large static electricity is applied to the gate of the NMOS transistor 4. In this case, the electro-static-discharge noise applies only a small number of pulsed voltages (for example, one). Although the counter 12 counts for the small number of times (for example, once), the number of counting times is not equal to or more than the predetermined number of times, which is set more than multiple number. Therefore, the counter 12 does not output the off command signal to the control circuit 13. That is, the off circuit 10 does not coercively turn off the NMOS transistor 4 for driving. As a result, when the pulsed electro-static-discharge noise is applied to the output terminal, the gate voltage of the NMOS transistor 4 for driving is increased due to the coupling and the self-turn-off of the NMOS transistor 4 occurs. The electro-static-discharge noise is released to the ground mainly through the drain-to-source of the NMOS transistor 4 for driving.

According to the first embodiment, when the noise is determined not to have periodicity, the off-operation of the NMOS transistor 4 performed by the off circuit 10 is disabled. When the noise is determined to have periodicity, the off-operation of the NMOS transistor 4 is performed by the off circuit 10 to enable the off-operation of the NMOS transistor 4. As a result, the ESD energy is withdrawn while stabilizing the circuit operation.

The counter 12 counts a numerical number of periodicities in the noise. When the numerical number of periodicities is equal to or more than the predetermined number of times, the noise is determined to have periodicity. As a result, the periodicity of the noise is determined by a simple circuit.

Second Embodiment

Figure 3:
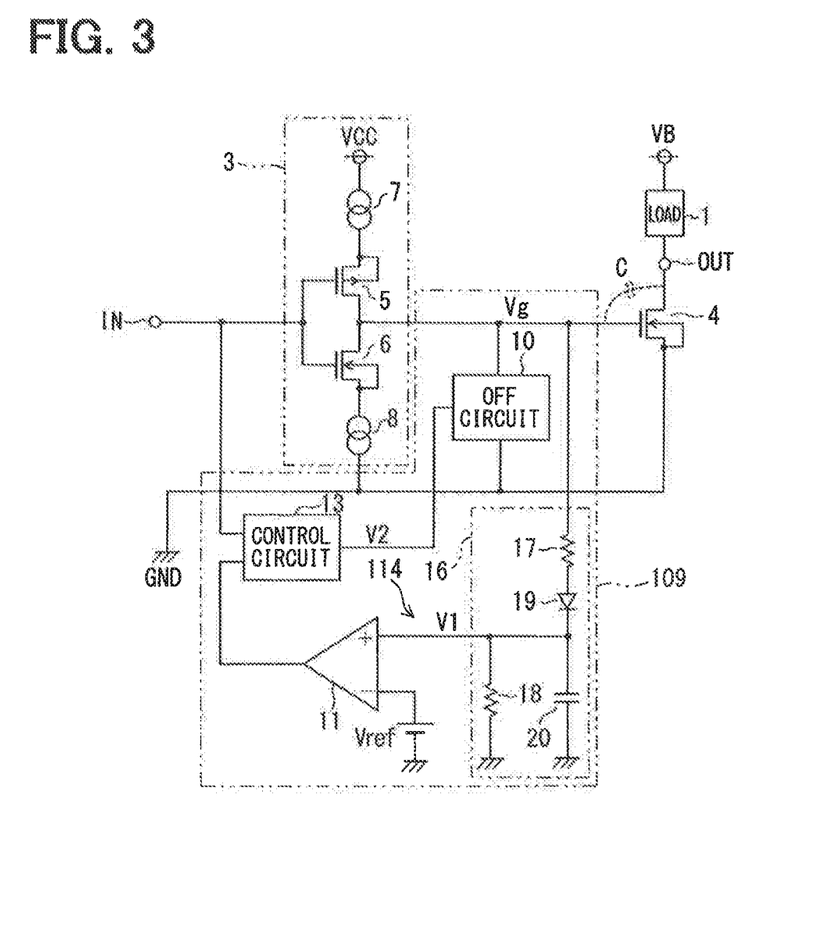
FIG. 3 is a configuration diagram schematically illustrating a configuration example of a protection circuit according to a second embodiment.
Figure 4:
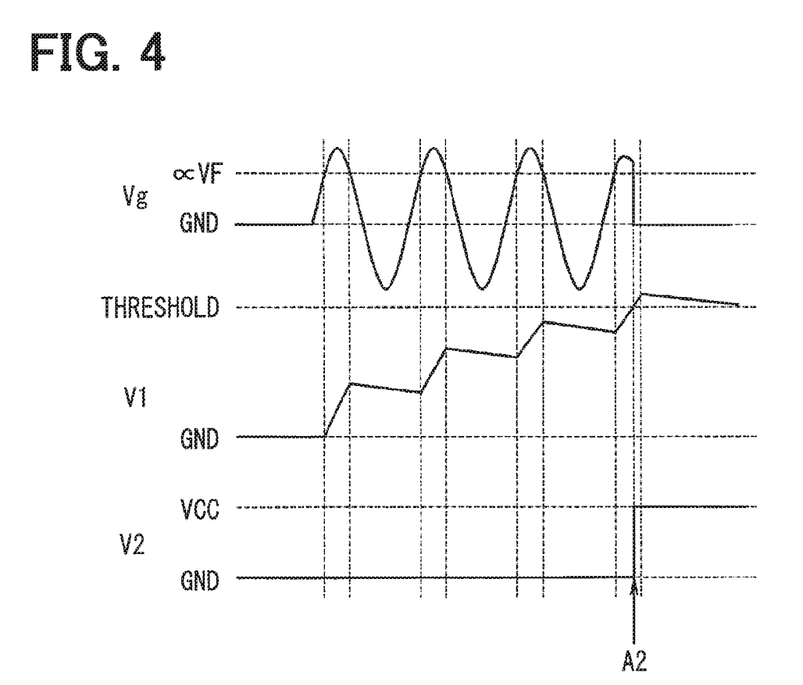
FIG. 4 is a timing chart schematically illustrating voltage variation of each node.

FIG. 3 and FIG. 4 are explanatory diagrams of the second embodiment. In the first embodiment, the comparison circuit 11 compares the original value of the gate voltage of the NMOS transistor 4 with the threshold voltage Vref. Conversely, in the second embodiment, the protection circuit 109 sequentially charges the gate voltage of the NMOS transistor 4 to a charge circuit 16 based on the signal generated according to the periodic noise. When a numerical number of charging times of the charge circuit 16 is equal to or more than the predetermined number of times, the protection circuit 19 performs the off-operation of the NMOS transistor 4.

As shown in FIG. 3, the charge circuit 16 is disposed at a former stage of the comparison circuit 11. The charge circuit 16 includes resistors 17, 18, a diode 19 and a capacitor 20. The charge circuit 16 is connected to the gate of the NMOS transistor 4. Since the other configurations are similar to the first embodiment, description thereof will be omitted. The charge circuit 16 and the comparison circuit 11 provide a periodicity determination device 114.

When the gate voltage of the NMOS transistor 4 is increased according to the periodic noise applied, a current according to the gate voltage is applied to the diode 19 in the forward direction and is charged in the capacitor 20. As shown in FIG. 4, resistance of each resistor 17, 18 and capacitance of the capacitor 20 are preliminarily adjusted so that the charged voltage of the capacitor 20 does not reach the threshold voltage Vref when the periodic noise is applied only for a small number of times (for example, once). Therefore, the charged voltage of the capacitor 20 does not reach the threshold voltage Vref until the periodic noise is applied for equal to or more than predetermined times and the number of charging times of the charge circuit 16 is equal to or more than predetermined number of times.

When the periodic noise is applied for equal to or more than predetermined times and the number of charging times of the charge circuit 16 is equal to or more than the predetermined number of times, the charge voltage of the capacitor 20 reaches the threshold voltage Vref. When the charge voltage of the capacitor 20 reaches the threshold voltage Vref, the comparison circuit 11 outputs the off command signal to the control circuit 13. In this case, the control circuit 13 coercively turns off the NMOS transistor 4 by the off circuit 10. For example, when the off circuit 10 includes the NMOS transistor 15, the control circuit 13 turns on the NMOS transistor 15 to short-circuit the gate and the source of the NMOS transistor 4 (see, a time point A2 In FIG. 4). The gate voltage of the NMOS transistor 4 is fixed to "L" (i.e., 0V). As a result, the influence of the malfunction caused by the periodic noise is restricted and the stability of the circuit operation is maintained.

When the electro-static-discharge noise, which is larger than the periodic noise, is applied to the connection terminal of the load 1 (i.e., the output terminal OUT), the large static electricity causes the coupling between the drain and the gate of the NMOS transistor 4. In this case, the electro-static-discharge noise applies only a small number of the large pulsed voltages (for example, one). The charge circuit 16 is charged for a small number of times (for example, once), but the charge voltage V1 is not equal to or larger than the predetermined threshold voltage Vref. Therefore, the comparison circuit 11 does not output the off command signal to the control circuit 13. That is, the off circuit 10 does not coercively turn off the NMOS transistor 4 for driving. As a result, when the pulsed electro-static-discharge noise is applied to the output terminal, the gate voltage of the NMOS transistor 4 for driving is increased due to the coupling between the drain and the gate of the NMOS transistor 4, and the self-turn-on of the NMOS transistor 4 occurs. The electro-static-discharge noise is released to the ground mainly through the drain-to-source of the NMOS transistor 4 for driving. Accordingly, also in the second embodiment, effects slimier to the first embodiment are achieved.

According to the second embodiment, the charge circuit 16 charges the current generating according to the periodic noise. When the number of charging times of the charge circuit 16 is equal to or more than the predetermined number of times, the noise is determined to have periodicity. That is, the periodicity of the noise is determined by a simple circuit.

Third Embodiment

Figure 5:
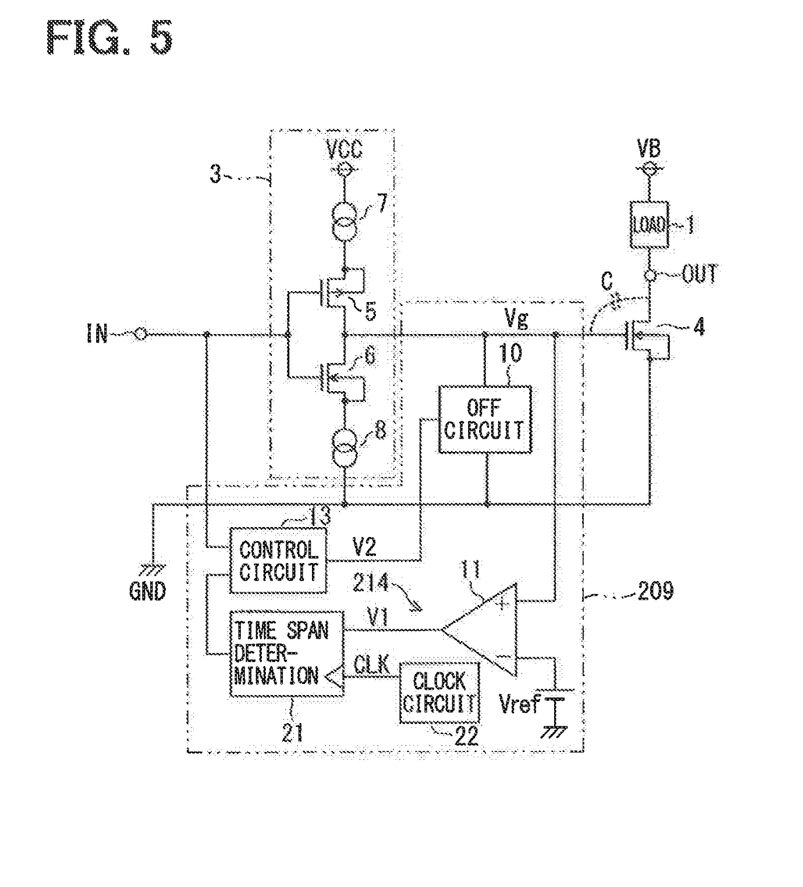
FIG. 5 is a configuration diagram schematically illustrating a configuration example of a protection circuit according to a third embodiment.
Figure 6:
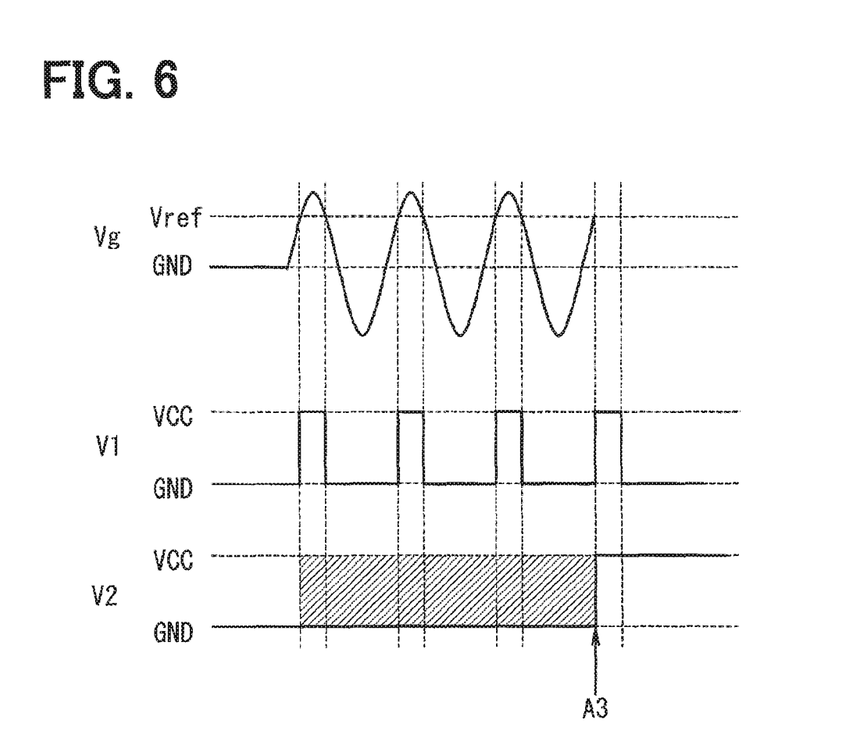
FIG. 6 is a timing chart schematically illustrating voltage variation of each node.

FIG. 5 and FIG. 6 are explanatory diagrams of the third embodiment. In the third embodiment, a configuration will be described in which periodicity of a noise is determined during a predetermined time span after the noise is initially detected. The third embodiment is different from the first embodiment in points of a protection circuit 209 including a time span determination portion 21 and a clock circuit 22, instead of the counter 12.

The comparison circuit 11 determines whether the gate voltage of the NMOS transistor 4 is equal to or larger than the threshold voltage Vref and outputs the comparison result to the time span determination portion 21. The time span determination portion 21 receives a clock signal from the dock circuit 22 and receives the comparison result of the comparison circuit 11. Then, the time span determination portion 21 determines, based on these signal and result, whether the periodic noise is continuously applied (see FIG. 6). The comparison circuit 11 and the time span determination portion 21 provide a periodicity determination device 214.

The clock circuit 22 outputs a clock signal having a predetermined period to the time span determination portion 21. For example, the predetermined period is set substantially shorter than the period of the assumed periodic noise. Especially, the time span determination portion 21 starts to measure time from a start time point, in which the gate voltage Vg of the gate NMOS transistor 4 initially becomes equal to or more than the threshold voltage Vref. The time span determination portion 21 continues to refer to the comparison result of the comparison circuit 11 at time points when the dock signal is applied, during a predetermined time span (for example, several micro seconds) after the start time point.

The time span determination portion 21 refers to the comparison result of the comparison circuit 11 and outputs the off command signal to the control circuit 13 when the time span determination portion 21 determines that the periodic noise is generated. In this case, the control circuit 13 coercively turns off the NMOS transistor 4 by the off circuit 10. As a result, the gate voltage of the NMOS transistor 4 is fixed to "L" (i.e., 0V) and the influence of the malfunction caused by the periodic noise is restricted.

When the electro-static-discharge noise (ESD) is applied to the connection terminal of the load 1 (i.e., the output terminal OUT), the large static electricity causes the coupling between the drain and the gate of the NMOS transistor 4. That is, the large static electricity is applied to the gate of the NMOS transistor 4. In this case, the electro-static-discharge noise applies only a small number of large pulsed voltages (for example, one). The charge voltage V1, which is the comparison result of the comparison circuit 11, is pulsedly increased only for a few times (for example once). Even when the time span determination portion 21 refers to the comparison result of the comparison circuit 11, the time span determination portion 21 does not determine that the voltage is periodically increased towards the voltage source VCC. Therefore, the time span determination portion 21 does not output the off command signal to the control circuit 13 and the off circuit 10 does not coercively turn off the NMOS transistor 4 for driving. As a result, when an impulse electro-static-discharge noise is applied to the output terminal OUT, the gate voltage of the NMOS transistor 4 for driving is increased according to the coupling and the NMOS transistor 4 is turned on. The electro-static-discharge noise is released to the ground mainly through the drain-to-source of the NMOS transistor 4 for driving.

Accordingly, also in the third embodiment, effects slimier to the first embodiment are achieved. The periodicity of the noise is determined during the predetermined time span after the noise is initially detected and the circuit is operated based on the determination result of the periodicity. As a result, reliability of the circuit operation is improved.

Fourth Embodiment

Figure 7:
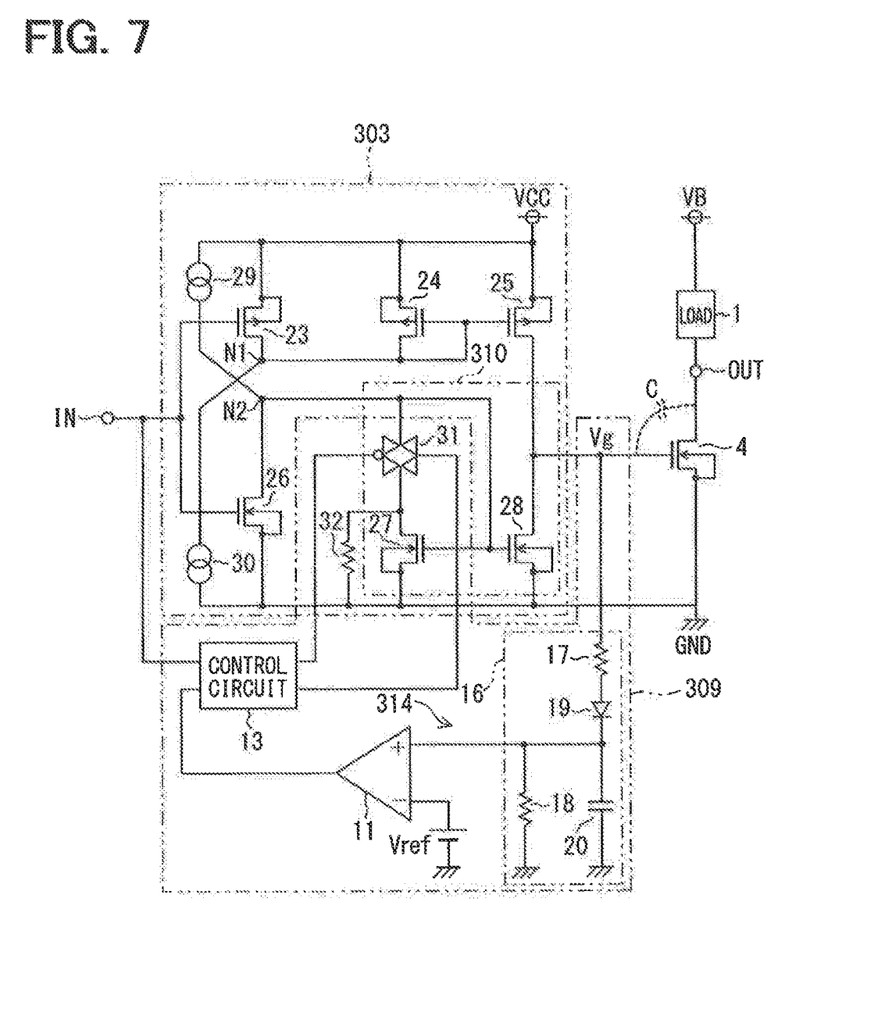
FIG. 7 is a configuration diagram schematically illustrating a configuration example of a protection circuit according to a fourth embodiment.

FIG. 7 is an explanatory diagram of the fourth embodiment. In the fourth embodiment, a configuration will be described in which the off circuit 10 is shared with at least a part of a main driving portion 303.

The main driving portion 303 is disposed at a former stage of the NMOS transistor 4, instead of the main driving portion 3. The main driving portion 303 mainly includes constant current inverters for driving connected in cascade. The main driving portion 303 includes PMOS transistors 23 to 25, NMOS transistors 26 to 28, constant current sources 29, 30, an analogue switch 31 and a resistor 32. In the present embodiment, although the configuration is described in which the constant current inverters for driving are connected in cascade, the main driving portion 303 may include only one step of the constant current inverters. In the present embodiment, although the configuration is described in which the protection circuit 309 has similar configuration to the protection circuit 109 of the second embodiment, the other protection circuit 9 or 209 may be employed. The NMOS transistor 28 corresponds to the second transistor.

The gate of the PMOS transistor 23 and the gate of the NMOS transistor 26 are commonly connected to the input terminal IN. The constant current sources 30 and 29 are respectively connected in series with the PMOS transistor 23 and the NMOS transistor 26. The drain-to-source of the PMOS transistor 23 and the constant current source 30 are connected in series with each other between the terminal of the voltage source VCC and the ground. The drain-to-source of the NMOS transistor 26 and the constant current source 29 are connected in series with each other between the terminal of the voltage source VCC and the ground. The charge circuit 16 and the comparison circuit 11 provide a periodicity determination device 314.

To an output node N1, which is a common connection point of the PMOS transistor 23 and the constant current source 30, the gate of the PMOS transistor 24 and the gate of the PMOS transistor 25 are connected. The PMOS transistors 24 and 25 are current-mirror connected to each other. To an output node N2, which is a common connection point of the NMOS transistor 26 and the constant current source 29, the gate of the NMOS transistor 27 and the gate of the NMOS transistor 28 are connected. The NMOS transistors 27 and 28 are current-mirror connected to each other. An analogue switch 31 is disposed between the output node N2 and the drain of the NMOS transistor 27. The analogue switch 31 is configured to be capable of being on-off controlled by the control circuit 13. The drain of the PMOS transistor 25 and the drain of the NMOS transistor 28 are commonly connected to each other and the common connection point is connected to the gate of the NMOS transistor 4. A resistor 32 is connected between the drain and the source of the NMOS transistor 27. The resistor 32 is a protection resistor releasing a large stored charge of the drain of the NMOS transistor 27.

An off circuit 310 is provided in the main driving portion 303 according to the present embodiment. For example, the off circuit 310 includes the analogue switch 31, the NMOS transistors 27, 28. The off circuit 310 is capable of coercively performing the off-operation of the NMOS transistor 4 according to the control signal of the control circuit 13.

The control circuit 13 receives the input data of the input terminal IN with the enable terminal thereof and receives the comparison result of the comparison circuit 11. When the input data of the input terminal IN indicates "L", the control circuit 13 receives the off command signal from the comparison circuit 11 and turns off the analogue switch 31 included in the off circuit 310. Conversely, when the input data of the input terminal IN indicates "H", the off circuit 310 does not output the off command signal and disables the function of the off circuit 310. Since the other configurations are similar to the second embodiment, the symbols employed in FIG. 3 of the second embodiment are employed in FIG. 7 and descriptions thereof are omitted.

The effects of the above configurations will be described. In the normal state, the control circuit 13 turns on the analogue switch 31. The output node N2, which is the common connection point of the constant current source 29 and the NMOS transistor 26, and the drain of the NMOS transistor 27 are electrically and conductively connected to each other. The NMOS transistor 27 and the NMOS transistor 28 are current-mirror connected to each other. That is, the NMOS transistor 27 and the NMOS transistor 28, the PMOS transistor 24 and the PMOS transistor 25 are respectively current-mirror connected to each other. The PMOS transistors 24 and 25 and the NMOS transistors 27 and 28 operate as the second inverter of constant current driving. As a result, the off circuit 310 does not coercively turn off the NMOS transistor 4 and the original operation of the off circuit 310 is disabled.

The digital signal input to the input terminal IN is varied between "H" and "L" according to the driving signal applied. The main driving portion 303 inverts the input digital signal twice. When the input digital signal indicates "H", the PMOS transistor 23 is turned off and the NMOS transistor 26 is turned on. Although the supply current of the constant current source 29 flows in the NMOS transistor 26, the supply current of the constant current source 30 withdraws the current of the PMOS transistors 24 and 25, which are current-mirror connected to each other. As a result, the current is applied to the gate of the NMOS transistor 4, which is located at the output side, through the PMOS transistor 25. The gate voltage of the NMOS transistor 4 is increased and the NMOS transistor 4 is turned on. Accordingly, the current is energized to the load 1. When the input data of the input terminal IN indicates "H", the control circuit 13 ignores the input signal from the comparison circuit 11 and keeps the analogue switch 31 of the off circuit 310 being turned off to disable the original operation of the off circuit 310.

Conversely, when the input digital signal indicates "L", the PMOS transistor 23 is turned on and the NMOS transistor 26 is turned off. Although the supply current of the constant current source 30 flows in the PMOS transistor 23, the supply current of the constant current source 29 flows in the NMOS transistors 27 and 28, which are current-mirror connected to each other and included in the off circuit 310. The NMOS transistor 27 discharges the stored electric charge of the gate of the NMOS transistor 4 by a constant current to turn off the NMOS transistor 4. As such, the energization to the load 1 is suspended.

Hereinafter, a situation will be described in which the input digital signal indicates "L" and the periodic noise (having, for example, around 20V of the maximum amplitude) is applied to the connection terminal of the load 1 (i.e., the output terminal OUT). When the input digital signal indicates "L", the main driving portion 303 inverts the input digital signal twice and the NMOS transistor 28 withdraws the current from the gate of the NMOS transistor 4.

When the periodic noise having large amplitude is applied to the output terminal, a capacitance coupling occurs between the drain and the gate of the NMOS transistor 4, and the periodic noise also occurs in the gate of the NMOS transistor 4.

The charge circuit 16 charges the gate voltage of the NMOS transistor 4 caused by the periodic noise. The comparison circuit 11 compares the charge voltage of the charge circuit 16 with the threshold voltage Vref and determines whether the charge voltage of the charge circuit 16 is equal to or larger than the threshold voltage Vref. When the number of charging times according to the periodic noise reaches the predetermined number of times, the control circuit 13 coercively performs the off-operation of the NMOS transistor 4 by the off circuit 310, according to the comparison result of the comparison circuit 11. When the control circuit 13 controls the off circuit 310 to perform the off-operation of the NMOS transistor 4, the analogue switch 31 is off-controlled. When the analogue switch 31 is turned off, the supply current of the constant current source 29 is not energized to the NMOS transistor 27, but directly inserted into the gate of the NMOS transistor 28. As such, the NMOS transistor 28 is operated in, so-called, a full-on-state. That is, if it is assumed that the NMOS transistors 27 and 28 are energized with the second current I2 in the normal current-mirror operation, the first current I1, which is larger than the second current I2, is energized when the NMOS transistor 28 is operated as the off circuit 310 in the full-on-state. Since the other operations such as the case in which the electro-static-discharge noise is applied to the connection terminal of the load 1 (i.e., output terminal OUT) are similar to those of the second embodiment, descriptions thereof will be omitted.

As described above, according to the present embodiment, the off circuit 310 operates to flow the second current I2 smaller than the first current I1 in the normal state and the off circuit 310 is shared with the part of the main driving portion 303. As a result, the function of the main driving portion 303 and the function of the off circuit 310 are shared, and thus a circuit size is restricted from increasing as much as possible.

Fifth Embodiment

Figure 8:
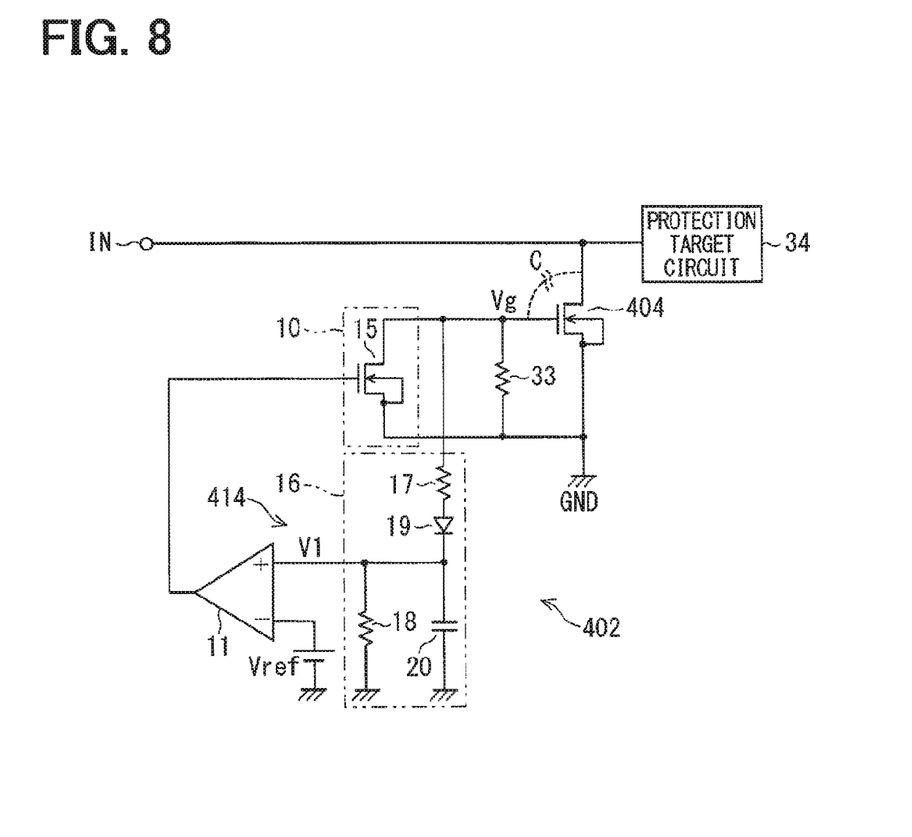
FIG. 8 is a configuration diagram schematically illustrating a configuration example of a protection circuit according to a fifth embodiment.

FIG. 8 is an explanatory diagram of the fifth embodiment. The fifth embodiment describes a configuration in which the present disclosure is applied to an ESD protection circuit 402. The ESD protection circuit 402 includes a comparison circuit 11, which also serves as the control device, an off circuit 10, a discharge transistor 404, a charge circuit 16, which includes resistors 17, 18, a diode 19 and a capacitor 20, and a resistor 33. The ESD protection circuit 402 protects a protection target circuit 34 from a noise generated in the input terminal IN. The protection target circuit 34 is applied with, for example, 5V of DC through the input terminal IN in the normal operation. The protection target circuit 34 is assumed as a circuit that should be protected from static electricity having a large voltage. The charge circuit 16 and the comparison circuit 11 provide the periodicity determination device 414. The discharge transistor 404 corresponds to the first transistor.

The discharge transistor 404 includes, for example, N-channel-type MOS transistor. The discharge transistor 404 has an input terminal (i.e., a drain) connected to an input line extending from the input terminal IN to the protection target circuit 34. The discharge transistor 404 has an output terminal (i.e., a source) connected to the ground. The resistor 33 is connected between a control terminal (i.e., a gate) of the discharge transistor 404 and a reference terminal (i.e., the source) of the discharge transistor 404. The off circuit 10 includes, for example, an N-channel-type MOS transistor 15. The drain-to-source of the MOS transistor 15 is connected in parallel with the resistor 33. A capability of energizing current of the MOS transistor 15 is lower than that of the discharge transistor 404. To the control terminal of the discharge transistor 404, similar circuits shown in FIG. 3 of the second embodiment (i.e., the charge circuit 16, the comparison circuit 11, which are the periodicity determination device and the control device) are connected.

Effects of the above configuration will be described. In the normal state, since the capacitor 20 is not energized, the comparison result of the comparison circuit 11 indicates "L". The NMOS transistor 15 included in the off circuit 10 is turned off. When the periodic noise having large amplitude is applied to the input terminal IN, the gate-to-source voltage of the discharge transistor 404 increases and the periodic noise is also generated in the gate of the discharge transistor 404. Similar to the description in the second embodiment, the charge circuit 16 charges the gate voltage Vg of the discharge transistor 404 caused by the periodic noise. The comparison circuit 11 compares the charge voltage of the charge circuit 16 with the threshold voltage Vref to determine whether the charge voltage exceeds the threshold voltage Vref. When the number of charging times according to the periodic noise reaches the predetermined number of times, the comparison circuit 11 outputs "H" as the comparison result to the off circuit 10 (i.e., the gate of the NMOS transistor 15). In this case, the off circuit 10 performs the off-operation of the discharge transistor 404.

As a result, the discharge transistor 404 is restricted from operating for the purpose other than the protection from the static electricity. For example, when 5V of DC is applied to the normal protection target circuit 34 through the input terminal IN from the external portion, and the discharge transistor 404 is turned on due to the generation of the periodic noise, there is a possibility that the discharge transistor 404 withdraws the current and the 5V of DC is not supplied to the internal protection target circuit 34. However, since the discharge transistor 404 does not operate for the purpose other than the protection from the static electricity, the 5V of DC is continuously supplied to the internal protection target circuit 34 from the input terminal IN.

When the electro-static-discharge noise is applied to the input terminal IN, the large static electricity causes the coupling between the drain and the gate of the discharge transistor 404 and the large static electricity is applied to the gate of the discharge transistor 404. In this case, the electro-static-discharge noise applies only a small number of pulsed voltages (for example, one). Although the charge circuit 16 is charged for the small number of times (for example, once), the charge voltage V1 does not exceeds the threshold voltage Vref and the comparison circuit 11 continues to output "L" as the comparison result. That is, the off circuit 10 does not coercively perform the off-operation of the discharge transistor 404. As a result, when the electro-static-discharge noise is applied to the input terminal IN, the voltage of the control terminal of the discharge transistor 404 is increased due to the coupling, and the self-turn-on of the discharge transistor 404 occurs. As such, the electro-static-discharge noise is released to the ground mainly through the input terminal and the output terminal (i.e., the drain-to-source) of the discharge transistor 404.

Accordingly, also in the fifth embodiment, effects similar to the above described embodiments are achieved.

Other Embodiments

The present disclosure is not limited to above described embodiments. The present disclosure may include, for example, the following modifications or extensions. Although the embodiments of the present disclosure are described hereinabove, each configuration of circuit, arrangement, size and value is just one example. The present disclosure is not limited to the embodiments and may be implemented in various other ways without departing from the gist of the present embodiment.

Although the inductive load for the vehicle is applied to the load 1, other load such as a solenoid or a motor may be applied.

Although the present disclosure is applied to low-side-drive, the present disclosure may be applied to high-side-drive. Although the configuration is described in which the transistors of the circuits (for example, the NMOS transistor 4 or the discharge transistor 404) are MOS transistors, a kind of transistor is not limited.

In the first to fourth embodiment, the configuration is described in which the noise applied to the drain of the NMOS transistor 4 (i.e., output terminal OUT) is directly detected. However, for example, when a resistor (which is not illustrated) is connected to the NMOS transistor 4, the noise may be detected indirectly through the resistor.

In FIG. 3 of the second embodiment, FIG. 7 of the fourth embodiment and FIG. 8 of the fifth embodiment, the configuration is described in which the charge circuit 16 is employed. However, the voltage conversion circuit is not limited to the charge circuit 16 and may be modified as far as capable of converting the signal caused by the periodic noise to voltage. Elements of the embodiments may be combined.

In the first to third and fifth embodiments, the configuration is descried in which the off circuit 10 includes one element of N-channel-type MOS transistor. Alternatively, the other kind of transistor may by employed and other elements such as a resistor or a capacitor may be combined to the transistor 15. In the fourth embodiment, the configuration is described in which the off circuit 310 is shared with at least a part of the main driving portion 303. However, a part of the off circuit 310 may be shared with at least a part of the main driving portion 303.

The present embodiment is not limited to the circuit configuration described in the embodiments. Other circuit topology may be employed as far as achieving the same function according to the above embodiments.

Although the embodiments of the present disclosure are described, the present disclosure is not limited to the embodiments described hereinabove. Various changes and modifications within a range of equivalents can be made in the present disclosure. Furthermore, various combination and formation, and other combination and formation including one, more than one or less than one element can be made in the present disclosure.

The invention claimed is:
1. A protection circuit comprising:
a periodicity determination device that directly or indirectly detects a noise superimposed on a first transistor and determines periodicity of the noise, the first transistor including a control terminal;

an off circuit that is connected to the control terminal of the first transistor and is configured to perform an off-operation of the first transistor; and a control device that disables the off-operation of the first transistor, performed by the off circuit, when the periodicity determination device determines that the noise does not have the periodicity, and that enables the off-operation of the first transistor, performed by the off circuit, when the periodicity determination device determines that the noise has the periodicity.

2. The protection circuit according to claim 1, further comprising:

a count device that counts a numerical number of periodicities in the noise, wherein the control device determines that the noise has the periodicity and enables the off-operation of the first transistor when the numerical number of periodicities, counted by the count device, is equal to or more than a predetermined number of times.

3. The protection circuit according to claim 2, wherein the count device counts, as the numerical number of periodicities, a numerical number of times that a voltage of the control terminal of the first transistor exceeds a threshold voltage of the first transistor.

4. The protection circuit according to claim 1, further comprising:

a voltage conversion circuit that converts a signal into voltage, the signal being generated according to the noise having the periodicity and superimposed on the first transistor, wherein the control device switches enablement and disablement of the off-operation of the first transistor, performed by the off circuit, according to the signal converted into voltage by the voltage conversion circuit.

5. The protection circuit according to claim 4, wherein the voltage conversion circuit includes a charge circuit that charges a current generated according to the noise having the periodicity and superimposed on the first transistor, and the control device determines that the noise has the periodicity and enables the off-operation of the first transistor when a numerical number of charging times of the charge circuit is equal to or more than a predetermined number of times.

6. The protection circuit according to claim 1, wherein the periodicity determination device determines the periodicity of the noise during a predetermined time span after the noise is initially detected.

7. The protection circuit according to claim 1, further comprising:

a main driving portion that is disposed at a former stage of the first transistor and normally drives the first transistor, wherein the off circuit is configured to flow a first current from the control terminal of the first transistor when the off circuit performs the off-operation of the first transistor, the off circuit is configured to flow a second current smaller than the first current in a normal state, and at least a part of the off circuit is shared with at least a part of the main driving portion.

8. The protection circuit according to claim 1, wherein the off circuit includes a second transistor.

9. The protection circuit according to claim 8, wherein the second transistor has a capability of energizing current lower than a capability of energizing current of the first transistor.

* * * * *